United States Patent
Xie

(10) Patent No.: US 8,319,117 B2
(45) Date of Patent: Nov. 27, 2012

(54) PRINTED CIRCUIT BOARD

(75) Inventor: Ze-Liang Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 239 days.

(21) Appl. No.: 12/840,748

(22) Filed: Jul. 21, 2010

(65) Prior Publication Data

US 2011/0297432 A1    Dec. 8, 2011

(30) Foreign Application Priority Data

Jun. 3, 2010  (CN) .......................... 2010 1 0191279

(51) Int. Cl.
*H05K 1/16* (2006.01)

(52) U.S. Cl. ........................................ 174/262; 174/350

(58) Field of Classification Search .......... 174/250–266, 174/378, 350; 29/829; 257/691, 664
See application file for complete search history.

(56) References Cited

U.S. PATENT DOCUMENTS

| | | | |
|---|---|---|---|
| 6,181,004 B1 * | 1/2001 | Koontz et al. ................. | 257/691 |
| 6,559,484 B1 * | 5/2003 | Li et al. ......................... | 257/207 |
| 8,023,241 B2 * | 9/2011 | Anthony et al. ............... | 361/118 |
| 2009/0188712 A1 * | 7/2009 | Clark et al. .................... | 174/378 |

* cited by examiner

*Primary Examiner* — Yuriy Semenenko
(74) *Attorney, Agent, or Firm* — Altis Law Group, Inc.

(57) ABSTRACT

A printed circuit board includes signal layers, ground layers, and a power layer, which are superposed. A closed trace is set along edges of each of the signal layers and the power layers. A number of vias are defined in each trace at intervals. Each via extends through the signal layers, the ground layers, and the power layer. Each via is electrically connected to the traces of the signal layers and the power layer, and electrically connected to the ground layers.

5 Claims, 2 Drawing Sheets

PRINTED CIRCUIT BOARD

BACKGROUND

1. Technical Field

The present disclosure relates to a printed circuit board.

2. Description of Related Art

Radio frequency current is known to exist at edges of multilayer high-speed printed circuit boards. The radio frequency current flows to low impedance sections, such as ground layers, thus electro-magnetic radiation is produced. This phenomenon is known as 'fringing effect'. According to the 20 H rule, if the distance between a power layer and the ground layer is H, extending the edges of the ground layer by 20 H can reduce electro-magnetic radiation of the fringing effect by 70%. However, extending the edges of the ground layer by 20 H may be difficult when the distance H between the power layer and the ground layer is large.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
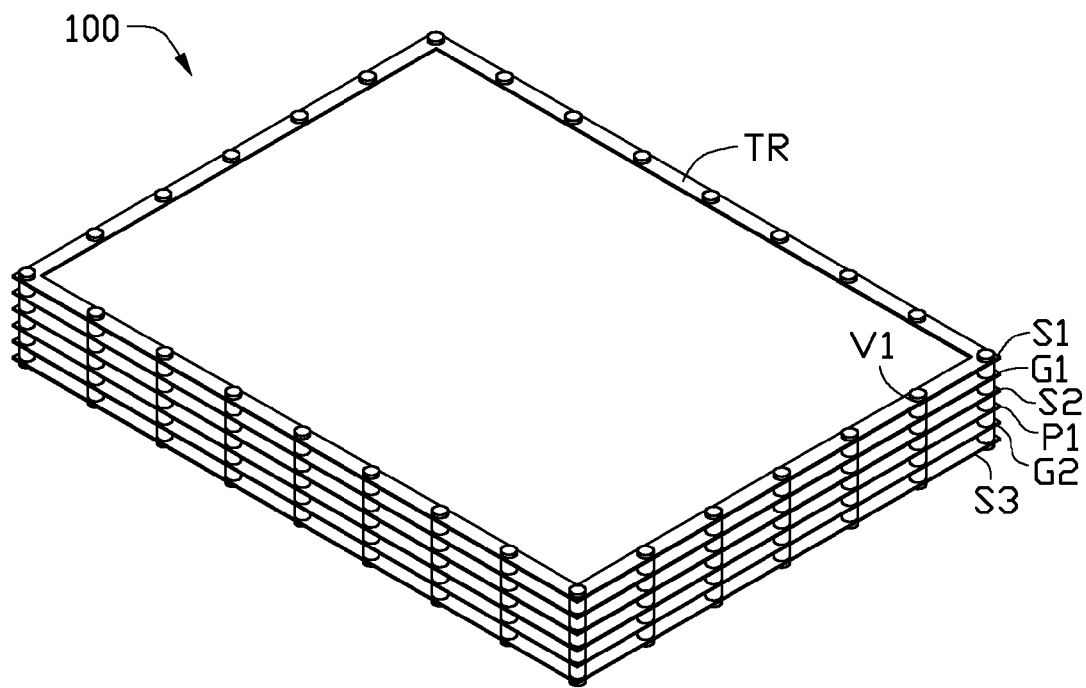
FIG. 1 is an isometric view of an exemplary embodiment of a printed circuit board.

Referring to FIG. 1, an exemplary embodiment of a printed circuit board 100 includes a first signal layer S1, a first ground layer G1, a second signal layer S2, a power layer P1, a second ground layer G2, and a third signal layer S3. The first signal layer 51, the first ground layer G1, the second signal layer S2, the power layer P1, the second ground layer G2, and the third signal layer S3 are superposed in that order. In other embodiments, the number and the arrangement of the signal layers, the ground layers, and the power layers may be changed according to requirements.

Figure 2:
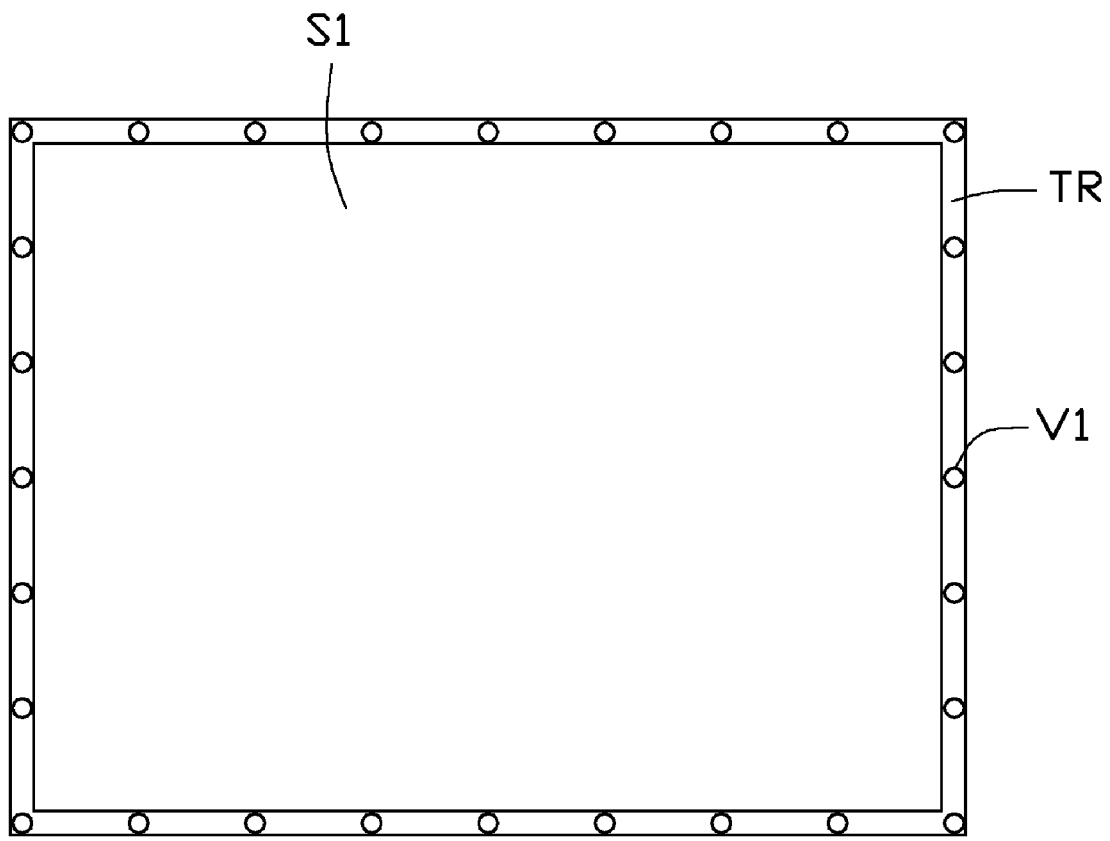
FIG. 2 is a top plan view of the printed circuit board of FIG. 1.

Referring to FIG. 2, a closed trace TR is set along edges of each signal layer and the power layer P1. The width of the trace TR is about 20 mils.

A plurality of vias V1 is defined in the trace TR of the first signal layer S1 at intervals. The distance between two adjacent vias V1 is about 40 mils. Each via V1 extends through the first ground layer G1, the second signal layer S2, the power layer P1, the second ground layer G2, and the third signal layer S3. The diameter of each via V1 is less than the width of the trace TR.

A copper-foil layer is set on the inner wall of each via V1. The copper-foil layer is electrically connected to the traces TR of the first signal layer S1, the second signal layer S2, the power layer P1, and the third signal layer S3. The copper-foil layer is also electrically connected to the first ground layer G1 and the second ground layer G2.

The traces TR, the vias V1, the first ground layer G1, and the second ground layer G2 compose a shielding grid, to prevent electro-magnetic radiation and the fringing effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board comprising a plurality of signal layers, a plurality of ground layers, and a power layer, wherein the signal layers, the ground layers, and the power layer are superposed, a closed trace is set along edges of each of the signal layers and the power layer, a plurality of vias are defined in each closed trace at intervals, each via extends through the signal layers, the ground layers, and the power layer, each via is electrically connected to the closed traces of the signal layers and the power layer, and is electrically connected to the ground layers.

2. The printed circuit board of claim 1, wherein the width of each closed trace is about 20 mils.

3. The printed circuit board of claim 1, wherein the distance between two adjacent vias is about 40 mils.

4. The printed circuit board of claim 3, wherein the diameter of each via is less than the width of each closed trace.

5. The printed circuit board of claim 1, wherein the plurality of signal layers comprises a first signal layer, a second signal layer, and a third signal layer; the plurality of ground layers comprises a first ground layer and a second ground layer; wherein the first signal layer, the first ground layer, the second signal layer, the power layer, the second ground layer, and the third signal layer are superposed in that order.

* * * * *